United States Patent
Forrest et al.

(10) Patent No.: US 9,513,337 B2
(45) Date of Patent: Dec. 6, 2016

(54) CIRCUITS AND METHODS FOR FAULT TESTING

(75) Inventors: Glenn A. Forrest, Bow, NH (US);
Aaron Cook, Deerfield, NH (US);
Dana Briere, Bedford, NH (US);
Devon Fernandez, Londonderry, NH (US); Naota Nakayama, Nashua, NH (US)

(73) Assignee: Allegro Microsystems, LLC, Worcester, MA (US)

( * ) Notice: Subject to any disclaimer, the term of this patent is extended or adjusted under 35 U.S.C. 154(b) by 1061 days.

(21) Appl. No.: 13/290,293

(22) Filed: Nov. 7, 2011

(65) Prior Publication Data

US 2013/0116945 A1    May 9, 2013

(51) Int. Cl.
*G01R 31/3185*    (2006.01)

(52) U.S. Cl.
CPC ........... *G01R 31/318552* (2013.01); *G01R 31/318594* (2013.01)

(58) Field of Classification Search
CPC ............ G01R 31/31858; G01R 31/31725; G01R 31/31727; G01R 31/31813; G06F 11/27; G06F 17/5031
USPC ................... 702/58, 107, 108, 117
See application file for complete search history.

(56) References Cited

U.S. PATENT DOCUMENTS

| | | | |
|---|---|---|---|
| 7,536,617 B2 | 5/2009 | Jun et al. | |
| 7,640,461 B2 | 12/2009 | Nguyen et al. | |
| 7,778,790 B2 | 8/2010 | Furuya | |
| 2003/0084390 A1 | 5/2003 | Tamarapalli et al. | |
| 2003/0115524 A1 | 6/2003 | Johnston et al. | |
| 2009/0024889 A1* | 1/2009 | Forrest et al. | 714/733 |
| 2009/0125769 A1* | 5/2009 | Nguyen et al. | 714/731 |
| 2010/0026279 A1* | 2/2010 | Vig et al. | 324/173 |
| 2010/0329381 A1* | 12/2010 | Shimizu et al. | 375/293 |
| 2011/0048102 A1 | 3/2011 | Fernandez et al. | |
| 2012/0047413 A1* | 2/2012 | Chung .......... G01R 31/318594 714/731 |

FOREIGN PATENT DOCUMENTS

JP    2002-163899    6/2002
JP    2011-203158    10/2011

(Continued)

OTHER PUBLICATIONS

Notification of International Search Report and Written Opinion of the International Searching Authority for PCT/US2012/060182, dated Feb. 11, 2013, 10 pages.

(Continued)

*Primary Examiner* — Alexander Satanovsky
*Assistant Examiner* — Ivan Rabovianski
(74) *Attorney, Agent, or Firm* — Daly, Crowley, Mofford & Durkee, LLP (57) ABSTRACT

An integrated circuit sensor includes circuitry and methods for generating a high speed delay fault test clock signal. A trimmable oscillator generates a master clock signal for use by an output protocol processor to provide the sensor output signal. A fault test clock signal generator is responsive to the master clock signal and to a test trigger signal for generating the test clock signal having a launch pulse and a capture pulse, each having edges substantially coincident with like edges of pulses of the master clock signal and a spacing between launch and capture pulses established by the trimmable master clock signal.

20 Claims, 4 Drawing Sheets

(56) References Cited

FOREIGN PATENT DOCUMENTS

WO     WO 03/069358     8/2003
WO     WO 2009/012006     1/2009

OTHER PUBLICATIONS

PCT International Preliminary Report on Patentability, Dated May 22, 2014; for PCT Pat APP No. PCT/US2012/060182; 7 Pages.
Japanese Office Action dated Mar. 3, 2016 with English Translation for Japanese Patent Application No. 2014-539969; 6 pages.
Japanese Notice of Allowance with English claims dated Aug. 1, 2016 for Japanese Application No. 2014-539969; 6 pages.
Japanese Response to Office Action with English translation dated May 17, 2016 for Japanese Application 2014-539969; 13 pages.

* cited by examiner

CIRCUITS AND METHODS FOR FAULT TESTING

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to electronic circuits and, more particularly, to circuits and methods for delay fault testing.

BACKGROUND OF THE INVENTION

As digital semiconductor Integrated Circuit (IC) geometries become smaller and signal speeds become faster, fault testing becomes more challenging. Various fault conditions such as marginal contacts, marginal vias, and marginal interconnects can cause signal delay faults.

Automatic Test Equipment (ATE) is used to generate test signals to exercise the digital IC and the resulting IC generated signals may be analyzed by the ATE and/or another external controller. An interface board, sometimes referred to as a Device Under Test (DUT) interface, is generally needed to adapt the ATE generated test signals to a particular IC. The ATE generated test signals generally include a clock signal and test vectors or patterns which are data streams tailored to test specific IC functions and/or signal paths, referred to generally as Automatic Test Pattern Generation (ATPG).

While delay fault testing is easiest achieved and therefore predominantly preformed at the wafer level, before the semiconductor wafer is separated for individual IC packaging, certain faults may occur after the IC is packaged. For example, the process of separating the semiconductor wafer and packaging the individual circuits can itself cause failures. Device level testing is sometimes performed where applications require; however, such testing even more complex and costly DUT boards than wafer level testing.

One type of fault testing is referred to as "stuck at" fault testing in which a signal line gets "stuck" at a particular voltage level. Testing for this type of fault is relatively simple and is achieved by measuring the voltage at various circuit nodes. Stuck at fault testing requires little to no timing information and is not particularly demanding on the ATE. However, stuck at fault testing may not be sufficient for certain critical applications. Another type of fault testing referred to as "at-speed" testing utilizes a clock signal having a frequency on the order of the operating frequency of the IC and is based on a transition and/or delay fault model. With at-speed testing, a test pattern is launched and the device response is captured at the operating speed.

At-speed delay fault testing may utilize a clock signal including a launch pulse and a capture pulse that have a close and precise timing relationship, such as a spacing on the order of 100 nanoseconds. One technique for generating such a launch/capture clock signal is with the use of a potentiometer in the ATE or the DUT interface board, with which the edge spacing is measured and the potentiometer adjusted to thereby adjust the edge spacing as desired. However, there are difficulties in measuring such close edge spacing without adversely impacting the clock signal itself. If the launch to capture pulse timing cannot be measured or measured accurately, then the potentiometer may be just adjusted until the DUT consistently passes a test, resulting in the test being run without accurate timing information.

SUMMARY OF THE INVENTION

According to the invention, an integrated circuit sensor includes an oscillator for generating a master clock signal that is used by an output protocol processor to generate a sensor output signal. A test clock signal generator is responsive to the master clock signal and to a test trigger signal for generating a test clock signal having a launch pulse and a capture pulse. In one embodiment, the sensor output signal is indicative of a direction of rotation of a ferromagnetic article proximate to the sensor and the direction of rotation is indicated by a pulse width established by the master clock signal. The launch and capture pulses of the test clock signal may substantially coincide with like edges of consecutive pulses of the master clock signal.

With this arrangement, accurate delay fault testing both at the wafer level and/or at the packaged IC level is achieved without requiring significant ATE and/or interface complexity and cost, by generating the high speed launch/capture test clock signal on the IC and in particular, by doing so in a way that does not require significant additional circuitry, using an oscillator that is already on the chip for other purposes.

The oscillator may be responsive to a trim signal for adjusting the master clock signal and thereby adjusting the edge spacing of the launch and capture pulses of the test clock signal. The trim signal may be generated in response to a programming signal that is superimposed on a power signal or a programming signal that is provided in the form of bits appended to an ATPG vector generated by the ATE.

The sensor may further include a fault test programming circuit for generating a test mode selection signal, wherein the fault test clock signal generator is further responsive to the test mode selection signal for generating the test clock signal. In one embodiment, the fault test programming circuit includes a multiplexer having a first input responsive to a scan clock signal, a second input responsive to the master clock signal, and an output at which the test trigger signal is provided. The multiplexer is responsive to a test mode enable signal for providing a selected one of the scan clock signal or the master clock signal as the test trigger signal, depending on the desired mode of operation.

Also described is a method of testing an integrated circuit sensor including the steps of generating a master clock signal with an oscillator, generating a test clock signal in response to the master clock signal and a test trigger signal, and generating a sensor output signal in response to the master clock signal. The test clock signal has a launch pulse and a capture pulse for delay fault testing that may have edges substantially coinciding with like edges of pulses of the master clock signal.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
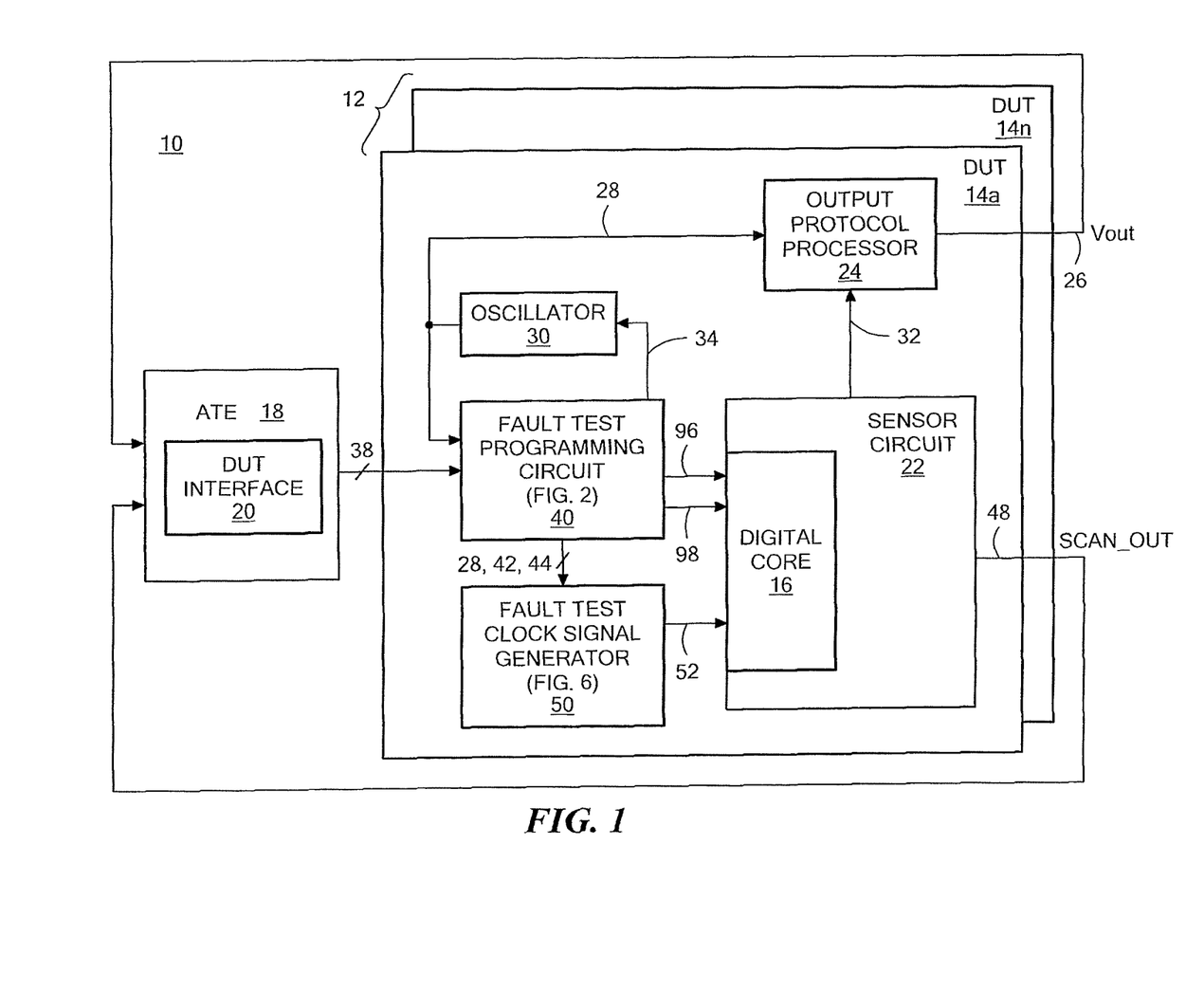
FIG. 1 is a block diagram of a test system for testing one or more DUTs.

Referring to FIG. 1, a test system 10 for testing one or more electronic circuit devices, or Devices Under Test (DUTs) 14a-14n, is shown. The DUTs 14a-14n may take the form of semiconductor ICs or ASICs for a variety of applications, each including a digital core 16 for which fault testing is desired. Fault testing may be performed during a stage of manufacture when a semiconductor wafer 12 supports the DUTs 14a-14n (i.e., wafer level testing). An Automatic Test Equipment (ATE) unit 18 including a DUT interface 20 is coupled to the wafer 12 for this purpose. It may also be desirable to perform testing on each individual DUT 14a-14n after the wafer is diced and the DUTs are individually packaged in which case the ATE 18 (or an alternative less complex ATE) is coupled to the individual DUT 14a for example.

In the illustrative embodiment, each DUT 14a-14n (as shown and described in conjunction with illustrative DUT 14a which is referred to herein alternatively as sensor IC 14a) includes a sensor circuit 22 coupled to an output protocol processor 24 which provides a sensor output signal, Vout, 26 at an output. In one embodiment, the sensor circuit 22 includes one or more magnetic field transducers, such as one or more Hall effect device(s), and the sensor output signal 26 is indicative of one or more characteristics of an article, such as a ferromagnetic article (not shown) that is in proximity to the sensor IC 14a in its operational (i.e., "in situ") environment. Illustrative sensed characteristics include current, speed, angle, linear position, and rotational direction. Furthermore, the sensor circuit 22 may sense other types of characteristics such as temperature, pressure, etc. Other types of magnetic field sensing elements, such as magnetoresistive elements (for example a giant magnetoresistance (GMR) element, an anisotropic magnetoresistance (AMR) element, a tunneling magnetoresistance (TMR) element, an Indium antimonide (InSb) sensor, a Gallium Arsenide (GaAs) sensor, and magnetic tunnel junction (MTJ) devices) are also suitable. The sensor circuit 22 may be a single ended or differential arrangement including one or more sensing elements in various known configurations.

In one embodiment, the sensor IC 14a is a gear tooth sensor for an automotive application, such as for fuel injection, anti-lock braking, or power steering applications, in which case the sensor circuit 22 may include a plurality of Hall effect devices for sensing a speed of rotation and/or a direction of rotation of a ferromagnetic gear.

The output protocol processor 24 is responsive to a master clock signal, MASTER_CLK, 28 for providing the sensor output signal 26. In one embodiment, where the sensor 14a senses a speed of rotation and a direction of rotation of a gear, the output protocol processor 24 may provide the sensor output signal 26 with pulses of a frequency proportional to the speed of rotation of the gear and a pulse width indicative of the direction of rotation of the gear. For example, a 50 μs wide pulse may indicate clockwise rotation and a 100 μs pulse may indicate counterclockwise rotation.

The sensor IC 14a further includes an oscillator 30 for generating the master clock signal 28. The master clock signal 28 is trimmable in response to a trim signal 34 for the purpose of calibrating and verifying the master clock signal and thus, the resulting sensor output signal 26 according to precise application driven specifications. During manufacture, the master clock signal 28 is monitored and its pulse width is adjusted as necessary in order to meet the particular output protocol specifications.

According to the invention, the sensor IC 14a contains circuitry and implements methods for generating an accurate delay fault test clock signal (rather than relying on the ATE to provide such signal). This arrangement simplifies the ATE 18 and DUT interface 20 requirements since it eliminates difficulties associated with generating an accurate high speed launch/capture test clock signal for example. As will be described, the IC generated test clock signal, CLK_CONTROLLER_OUT, 52 contains launch and capture pulses that have rising and falling edges substantially coinciding with like edges of pulses of the master clock signal 28. This arrangement is advantageous because of the otherwise required precision of the master clock signal (since it is used to generate the sensor output signal) and the trimming that is therefore performed. Additionally, having the test clock signal 52 edges follow the master clock signal edges is a more accurate approach than independently triggering the launch and capture pulse edges for example. Furthermore, the described on chip test clock signal generation is particularly cost effective since the master clock signal 28 that is used to generate the test clock signal 52 is required to be generated for a different sensor function; namely for use by the output protocol processor 24 to generate the sensor output signal 26.

To this end, the sensor IC 14a includes a fault test programming circuit 40 and a fault test clock signal generator 50, as shown. The fault test programming circuit 40 is shown and described in conjunction with FIG. 2. Suffice it to say here that the programming circuit 40 is responsive to the master clock signal 28 and to ATE generated signals 38, for providing input signals (in the form of the master clock signal 28, a test trigger signal CLK_CONTROLLER_IN 42, and a test mode enable signal TM_PULSE_DOUBLE 44) to the fault test clock signal generator 50. The ATE generated signals 38 include various test clock options (PAD_SCAN_CLK and PIN3_CLK), a test enable signal PAD_SCAN_EN, a test vector data signal PAD_SCAN_IN, and a programming signal VCC_PROG. The programming circuit 40 is responsive to the ATE provided test vector data signal PAD_SCAN_IN and to an alternative data signal TM_PAD_SCAN_IN (FIG. 2) to provide a data signal, SCAN_IN, 96 to the digital core 16. Similarly, the programming circuit 40 is responsive to the ATE provided test enable signal PAD_SCAN_EN 78 and to an alternative test enable signal TM_SCAN_EN (FIG. 2) to provide a test enable signal, SCAN_EN, 98 to the digital core.

Figure 5:
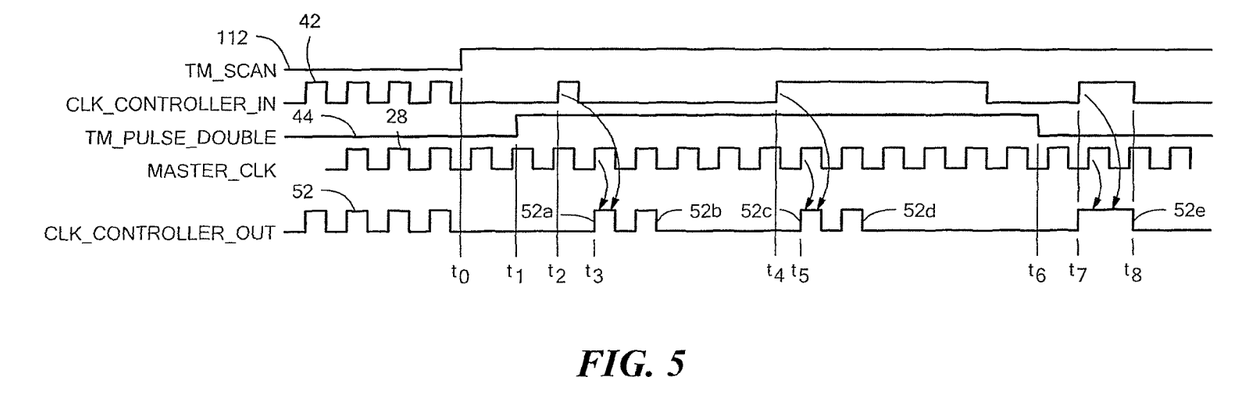
FIG. 5 shows several illustrative waveforms associated with the fault test clock signal generator of FIG. 1.
Figure 6:
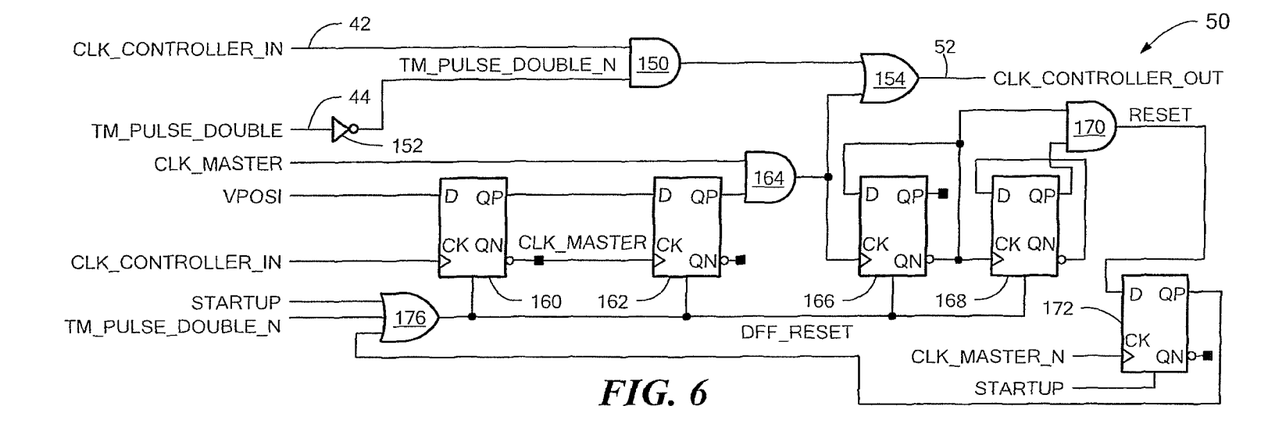
FIG. 6 is a simplified schematic of the fault test clock signal generator of FIG. 1.

The fault test clock signal generator 50 generates the test clock signal CLK_CONTROLLER_OUT 52 as is shown and described in conjunction with FIGS. 5 and 6. During testing, the digital core 16 is exercised by the SCAN_IN data signal 96 under the control of the test enable signal SCAN_EN 98 and the test clock signal 52.

An output signal of the digital core, SCAN_OUT, 48 is fed back to the ATE 18 or to another controller for evaluation of the sensor's response to the data signal 96. Evaluation of the sensor's response may include parametric fault evaluation as will be described.

Figure 2:
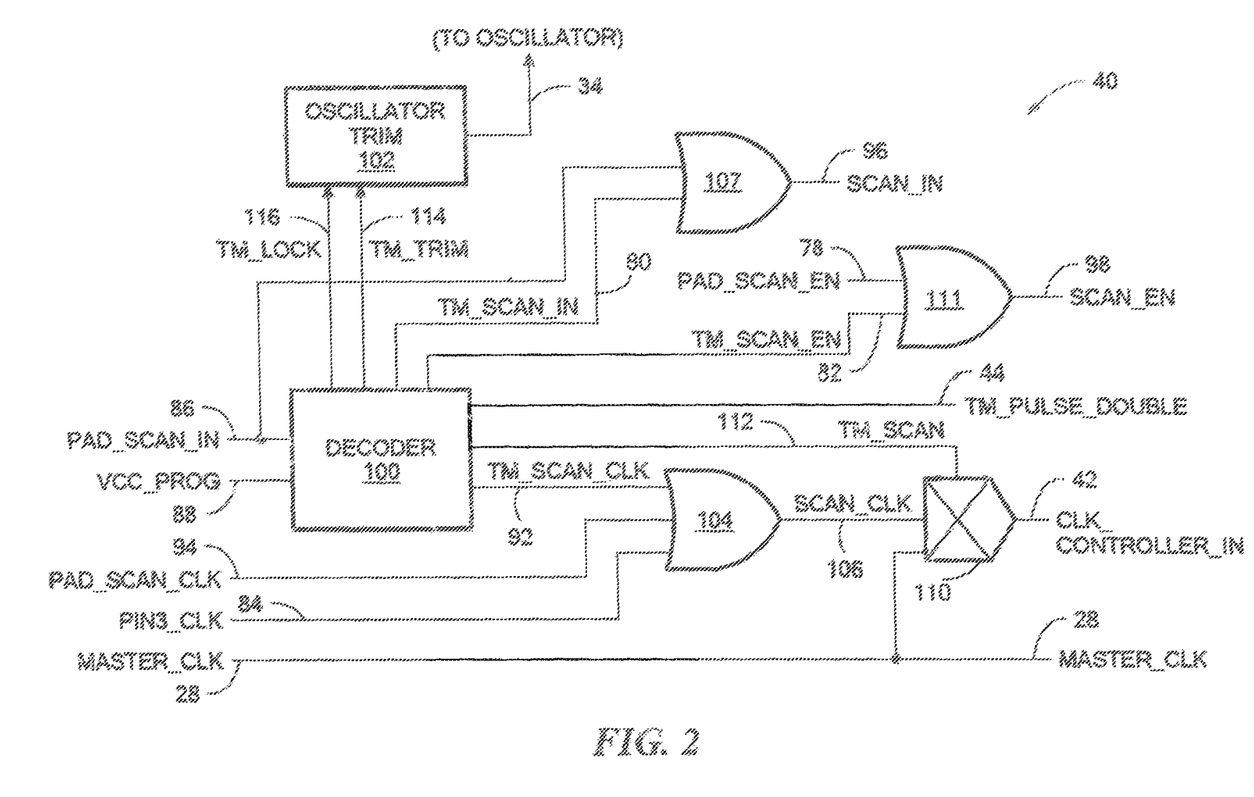
FIG. 2 is a simplified schematic of the fault test programming circuit of FIG. 1.

Referring also to FIG. 2, the fault test programming circuit 40 is responsive to the ATE generated signals 38, and here, specifically including the PAD_SCAN_IN signal 86, the PAD_SCAN_CLK signal 94, the PIN3_CLK signal 84, the VCC_PROG signal 88, and the PAD_SCAN_EN signal 78. The programming circuit generates the test mode enable signal, TM_PULSE_DOUBLE, 44 and the test trigger signal CLK_CONTROLLER_IN 42 for use by the fault test clock signal generator 50.

The sensor IC 14a is capable of various modes of operation. Normal, in situ operation refers to operation of the sensor 14a in its intended end use environment (e.g., in an automobile anti-lock brake system). In this mode of operation, as will become apparent, the output protocol processor 24 responds to a sensor circuit output signal 32 and to the master clock signal 28 by providing the sensor output signal 26 with a frequency indicative of a speed of rotation and a pulse width indicative of a direction of rotation.

The sensor 14a is also capable of operating in different test modes depending on the type of testing desired. Before initiating a test mode, registers of the digital core 16 are loaded. When asserted, the test enable signal SCAN_EN 98 causes the digital core registers to be loaded with the test data 96. In one embodiment, during normal, in-situ operation, the test enable signal 98 is deasserted.

In a first test mode, the test clock signal CLK_CONTROLLER_OUT 52 provided to the digital core 16 contains a single clock pulse. In this mode of operation, the data signal SCAN_IN 96 is clocked once, as may be useful to perform stuck at scan testing.

In a second test mode, the test clock signal CLK_CONTROLLER_OUT 52 provided to the digital core 16 contains dual clock pulses, in the form of a launch pulse and a capture pulse, for each test vector of the data signal 96. This type of test mode is useful for at-speed delay fault testing.

According to an aspect of the invention, a user programmable VCC_PROG signal 88 is provided for wafer and/or package level testing. The VCC_PROG signal is used to provide a plurality of commands to a DUT 14a during package level testing since the packaged sensor IC 14a has limited connections. The VCC_PROG signal 88 can also be used to provide test commands in connection with wafer level testing. The VCC_PROG signal 88 is slower than the PAD_SCAN_IN signal 86 and therefore when used for package level testing, generally the testing is stuck at testing rather than at-speed testing. It will be appreciated that when performing package level stuck at testing, the VCC_PROG signal 88 may be provided by an ATE that is less complex than the ATE 18, for example, an ATE that does not implement ATPG.

Figure 3:
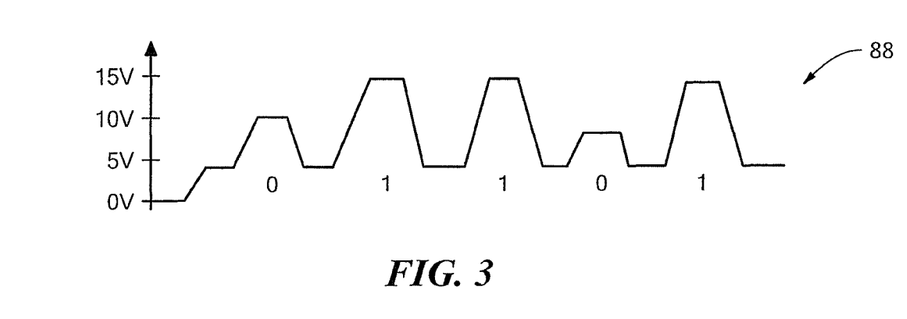
FIG. 3 shows an illustrative Vcc programming signal.

In one embodiment, the VCC_PROG signal 88 is a user programmed stream of high and low voltage pulses superimposed on the $V_{CC}$ power signal as is shown in FIG. 3. The programming circuit 40 includes a decoder 100 containing circuitry, as may include a resistor divider and comparators, to interpret the voltage pulse level and to provide various test commands accordingly.

The test mode selection signal TM_PULSE_DOUBLE 44 establishes whether the sensor IC 14a is in the first test mode in which a single pulse test clock signal is presented to the digital core 16 for stuck at testing (in one embodiment occurring when the signal 44 is low) or in the second test mode in which a dual launch/capture pulse test clock signal is presented to the digital core 16 for at-speed delay fault testing (in one embodiment occurring when the signal 44 is high). In one embodiment, the TM_PULSE_DOUBLE 44 signal is provided by the VCC_PROG signal 88.

Depending on the test mode selected and sensor testing requirements, various clock signals are available for providing the test trigger signal 42 (which is used by the test clock signal generator 50 to provide the test clock signal 52 to the digital core 16, as will be described). To this end, the programming circuit 40 includes an OR gate 104 having inputs to which ATE generated clock signals PAD_SCAN_CLK 94 and PIN3_CLK 84 are coupled and an input to which a further clock signal option TM_SCAN_CLK 92 is coupled.

The TM_SCAN_CLK signal 92 is a user programmed clock signal for establishing a desired spacing between the launch and capture pulses of the test clock signal 52 for using during the second test mode of operation, as will be described. The TM_SCAN_CLK signal 92 may be provided by the VCC_PROG signal 88 or by the PAD_SCAN_IN signal 86 as will be described.

The output of the OR gate 104 provides a SCAN_CLK signal 106 to a multiplexer 110. A second input to the multiplexer 110 is provided by the master clock signal 28, as shown. The multiplexer 110 is controlled by a test mode enable signal, TM_SCAN, 112 that establishes whether the sensor IC 14a is in normal, in situ operation or in a test mode. The TM_SCAN signal 112 is provided by the VCC_PROG signal 88. In one embodiment, when the TM_SCAN signal 112 is high, the sensor IC 14a is in a test mode and when it is low, the IC is in normal operation.

In normal operation, the test trigger signal CLK_CONTROLLER_IN 42 at the output of the multiplexer 110 is provided by the master clock signal 28. In this way, the master clock signal 28 is passed through the programming circuit 40 to clock the digital circuit 16.

When the TM_SCAN signal 112 is high, the SCAN_CLK signal 106 is provided as the test trigger signal 42 at the output of the multiplexer 110. Thus, during testing, the CLK_CONTROLLER_IN signal 42 is provided by the PAD_SCAN_CLK signal 94, PIN3_CLK signal 84, or the TM_SCAN_CLK signal 92.

The decoder 100 processes the VCC_PROG signal 88 to provide an alternative test data signal TM_SCAN_IN 80, an alternative test enable signal TM_SCAN_EN 82, and the TM_SCAN_CLK signal 92. The alternative test data signal TM_SCAN_IN 80 and test enable signal TM_SCAN_EN 82 may be referred to as chip or package level signals, since they are provided by the VCC_PROG signal 88 as may be useful for chip level testing.

The test vector data signal PAD_SCAN_IN 86 and alternative test data signal TM_SCAN_IN 80 are digital data streams representing test vectors as may be generated by ATPG within the ATE and tailored to test specific IC functions and/or signal paths. An OR gate 107 is responsive to the PAD_SCAN_IN signal 86 and to the TM_SCAN_IN signal 80 and provides the SCAN_IN signal 96 at its output for coupling to the digital core. Thus, the SCAN_IN signal 96 is provided by either the PAD_SCAN_IN signal 86 or the TM_SCAN_IN signal 80 depending on whether wafer level testing or package level testing is being performed.

Similarly, an OR gate 111 is responsive to the PAD_SCAN_EN signal 78 and to the TM_SCAN_EN signal 82 and provides the SCAN_EN signal 98 at its output for coupling to the digital core. Thus, the SCAN_EN signal 98 is provided by either the PAD_SCAN_EN signal 78 or the TM_SCAN_EN signal 82 depending on whether wafer level testing or package level testing is being performed.

According to an aspect of the invention, the test vector data signal PAD_SCAN_IN 86 may be used to program a particular spacing between launch and capture pulses of the test clock signal 52. To this end, the test vector data signal 86 may contain additional bits for programming the launch/capture pulse timing in the delay fault mode of testing. In this embodiment, the decoder 100 removes the appended bits and provides the bits to an oscillator trim circuit 102 in the form of a trim signal 114.

Figure 4:
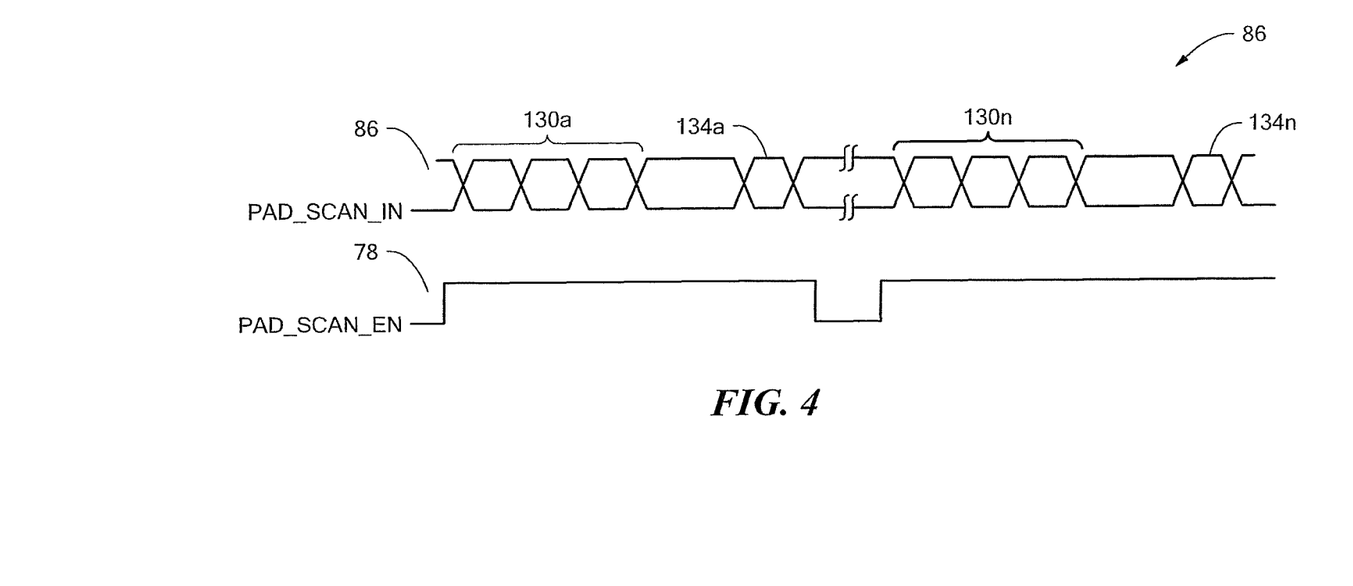
FIG. 4 shows an illustrative test vector data signal with bits appended to establish launch and capture pulse timing.

Referring also to FIG. 4, an illustrative test vector data signal PAD_SCAN_IN 86 is shown to include scan data and additional bits to set the spacing between rising edges of launch and capture pulses in the test clock signal 52. For each test vector data set 130a-130n, different appended bits 134a-134n, respectively, are provided to correspond to the different respective test vector. More particularly, different spacing between launch and capture pulses is used for different fault tests. Also shown in FIG. 4 is the test enable signal 78 that permits shifting data to load the digital core 16 when asserted.

According to another aspect of the invention, the launch/capture pulse timing may be user programmed via the VCC_PROG signal 88. The decoder 100 interprets the VCC_PROG signal 88 and provides bits to set the launch to capture pulse timing accordingly to the oscillator trim circuit 102 as the trim signal 114.

The ability to easily adjust the launch to capture pulse edge spacing lends itself to parametric fault testing. For example, in the case of the test vector data signal 86 (FIG. 4) establishing the launch/capture timing, in a first test vector 130a, the appended bits 134a can establish a first launch/capture timing that is expected to yield a first predetermined digital output signal 48 corresponding to one set of conditions (e.g., nominal timing). Bits 134n appended to a different test vector 130n can establish a different launch/capture timing (e.g., a larger spacing) that is expected to yield a second predetermined output signal 48 corresponding to a different set of conditions (e.g., cold timing).

As noted above, the master clock signal 28 generated by the oscillator 30 (FIG. 1) is trimmable. To this end, the fault test programming circuit 40 includes the oscillator trim circuit 102 that is responsive to the digital control signal TM_TRIM 114. More particularly, the oscillator trim circuit 102 converts the digital control signal TM_TRIM 114, such as a three bit signal, into the analog trim signal 34. In one embodiment, the oscillator is responsive to the current level of the trim signal for adjusting the pulse width and/or frequency of the master clock signal.

During manufacture, the master clock signal 28 may be calibrated by measuring its pulse width. If the pulse width is determined to be other than as expected for use by the output protocol processor 24 (FIG. 1) in generating the sensor output signal 26, then the trim control signal 34 can be adjusted by the user and the resulting master clock signal 28 verified by further monitoring. A TM_LOCK signal 116 is also provided, for example via the VCC_PROG signal 88, in order to lock or fix the master clock pulse width once it is determined to precisely meet the necessary specification, such as with the use of poly fuses to lock the digital to analog converter of the trim circuit 102. In this way, the accuracy of the resulting sensor output signal 26 is monitored.

According to an aspect of the invention, the oscillator 30 is also trimmable for the purpose of establishing and adjusting the spacing between launch and capture pulses of the test clock signal 52. The digital trim signal TM_TRIM 114 has a digital value indicative of the desired frequency for the master clock signal 28 and may be provided by the user via bits appended to the ATE generated PAD_SCAN_IN signal 86 (FIG. 4) or alternatively may be provided by the user via Vcc programming signal VCC_PROG 88 (FIG. 3). Here, the trim signal 34 adjusts the frequency of the master clock signal 28 and by doing so adjusts the spacing between launch and capture pulses. The TM_LOCK signal 116 is not used in the second test mode, when the oscillator is being trimmed to establish launch/capture pulse timing, since the TM_TRIM signal 114 will be changed in order to provide a different master clock frequency for each different test vector.

Referring also to the illustrative signals of FIG. 5, at a time $t_0$, the test mode enable signal TM_SCAN 112 (FIG. 2) is asserted to thereby commence testing. Thus, before time t0, the IC 14a is in normal, in situ operation in which the CLK_CONTROLLER_IN signal 42 is provided by the MASTER_CLK signal 28. After time $t_0$, the CLK_CONTROLLER_IN signal 42 is provided by the SCAN_CLK signal 106 at the output of OR gate 104.

Once in test mode, when the test mode selection signal TM_PULSE_DOUBLE 44 goes high, as occurs at time $t_1$, the second mode of testing is commenced. In the second mode of testing, the test clock signal 52 requires launch and capture pulses for at-speed testing. In this mode, each rising edge of the test trigger signal CLK_CONTROLLER_IN 42 triggers a launch and capture pulse pair, as shown to commence at time $t_2$. More particularly, the launch and capture pulses 52a, 52b have rising and falling edges that substantially coincide with the two rising edges and falling edges of the two master clock signal pulses occurring after the trigger signal 42 goes high, respectively, as commences here at time $t_3$. Thus it becomes apparent that the launch/capture pulse spacing is adjustable by adjusting the frequency of the master clock signal 28, such as by the above-described trimming methodologies.

Another pair of launch/capture pulses 52c, 52d is triggered by the next rising edge of the test trigger signal 42, as occurs at time $t_4$, such that the launch/capture pulses 52c, 52d commence on the next rising edge of the master clock signal 28 at time $t_5$. Here again, the rising and falling edges of the capture and launch pulses 52c, 52d substantially coincide with the rising and falling edges of the next two consecutive master clock signal pulses, respectively.

When the test mode selection signal 44 goes low, as occurs at time $t_6$, the first mode of testing is commenced in which the digital core 16 is responsive to a single pulse test clock for stuck at testing. Accordingly, in this mode, a rising edge of the test trigger signal 42, as occurs at time $t_7$, triggers a single test clock pulse 52e. The width of the single pulse 52e here is set by the test trigger signal 42 and specifically, the pulse 52e terminates when the test trigger signal 42 goes low, here at time $t_8$. It will be appreciated by those of ordinary skill in the art that other scenarios for establishing the same or a different pulse width for the single clock pulse 52e are possible.

Referring also to FIG. 6, the fault test clock signal generator 50 is shown. As noted above, the generator 50 is responsive to the master clock signal 28, the test trigger signal CLK_CONTROLLER_IN 42, and the test mode enable signal TM_PULSE_DOUBLE 44. In the normal mode of operation, the output signal of the clock signal generator 50 (i.e., the test clock signal 52) is the master clock signal 28 and in the test modes of operation, the test clock signal 52 clocks the test data signal (SCAN_IN) 96 into the digital core 16 with either a single pulse in the first test mode or with a dual launch/capture pulse pair in the second test mode.

The fault test clock signal generator 50 includes an AND gate 150 that is responsive to an inverted version of the TM_PULSE_DOUBLE signal at the output of an inverter 152 and to the CLK_CONTROLLER_IN signal 42. The output of the AND gate 150 provides an input to an OR gate 154. The output of the OR gate 154 is the CLK_CONTROLLER_OUT signal 52. With this arrangement, when the TM_SCAN signal 112 is low, the test clock signal 52 is provided by the master clock signal 28 (as triggered by the CLK_CONTROLLER_IN signal) and when the TM_SCAN signal goes high, each rising edge of the test trigger signal 42 triggers either a single clock pulse or a launch/capture pulse pair on the test clock signal 52, depending on the state of the test mode selection TM_PULSE_DOUBLE signal 44.

Flip-flops 160, 162 and AND gate 164 are configured to synchronize the test clock signal 52 to the next rising edge of the master clock signal 28 and flip-flops 166, 168, AND gate 170, and flip-flop 172 are configured to cause the test clock signal 52 to include two full pulses of the master clock signal 28 in response to each rising edge of the test trigger signal 42 occurring when the test mode selection signal 44 is asserted. An OR gate 176 is responsive to the output of flip-flop 172, a STARTUP signal 178, and the inverted version of the TM_PULSE_DOUBLE signal 44 for resetting the flip-flops 160, 162, 166, and 168. The STARTUP signal 178 provides a reset command on start up of the IC 14a.

Having described preferred embodiments of the invention it will now become apparent to those of ordinary skill in the art that other embodiments incorporating these concepts may be used. Accordingly, it is submitted that that the invention should not be limited to the described embodiments but rather should be limited only by the spirit and scope of the appended claims. All publications and references cited herein are expressly incorporated herein by reference in their entirety.

What is claimed is:

1. An integrated circuit sensor comprising:
    an oscillator for generating a master clock signal that is used by the integrated circuit sensor both when the integrated circuit sensor is functioning in a test mode and when the integrated circuit sensor is functioning in a normal operational mode, wherein, when the integrated circuit sensor is functioning in a test mode, a frequency of the master clock signal is based at least in part on an externally generated programming signal provided to the integrated circuit sensor;
    a fault test clock signal generator responsive to the master clock signal and to a test trigger signal, the fault test clock signal generator configured to generate, during test of the integrated circuit sensor when the integrated circuit sensor is functioning in its test mode, a test clock signal derived at least in part from the master clock signal, wherein the test clock signal comprises a launch pulse and a capture pulse used during at least a portion of delay fault testing of the integrated circuit sensor, the launch and capture pulses having a controllable time spacing between an edge of the launch pulse and an edge of the capture pulse, wherein different values of the controllable time spacing are usable for different fault tests, and wherein the controllable time spacing is controlled based at least in part on information conveyed via the externally generated programming signal; and
    an output processor responsive to the master clock signal and to information provided by the integrated circuit sensor relating to a ferromagnetic article disposed in proximity to the integrated circuit sensor when the integrated circuit sensor is functioning in its normal operational mode, the output processor providing, a sensor output signal indicative of one or more characteristics of the article.

2. The integrated circuit sensor of claim 1 wherein the launch pulse and the capture pulse of the test clock signal have rising and falling edges that substantially coincide with like edges of consecutive pulses of the master clock signal.

3. The integrated circuit sensor of claim 1 wherein the oscillator is responsive to a trim signal for adjusting the master clock signal.

4. The integrated circuit sensor of claim 3 wherein the trim signal is based on a measurement of the master clock signal in order to calibrate the master clock signal.

5. The integrated circuit sensor of claim 3 further comprising a fault test programming circuit for generating a test mode selection signal, wherein the fault test clock signal generator is further responsive to the test mode selection signal for generating the test clock signal.

6. The integrated circuit sensor of claim 5 wherein the fault test programming circuit comprises a multiplexer having a first input responsive to a scan clock signal, a second input responsive to the master clock signal, and an output at which the test trigger signal is provided, wherein the multiplexer is responsive to a test mode enable signal for providing a selected one of the scan clock signal and the master clock signal as the test trigger signal.

7. The integrated circuit sensor of claim 5 wherein the fault test programming circuit further comprises a decoder for generating the trim signal in response to the externally generated programming signal.

8. The integrated circuit sensor of claim 1 wherein the sensor output signal is indicative of a direction of rotation of the ferromagnetic article proximate to the integrated circuit sensor.

9. The integrated circuit sensor of claim 8 wherein the direction of rotation is indicated by a pulse width established by the master clock signal.

10. The integrated circuit sensor of claim 1 wherein the externally generated programming signal is superimposed on a power signal used to provide operational power to the integrated circuit sensor.

11. The integrated circuit sensor of claim 1 wherein the externally generated programming signal comprises a data input signal from an automated test pattern generator (ATPG), wherein the oscillator generates the master clock signal at least partially in accordance with information appended to the data signal provided by the ATPG.

12. An integrated circuit sensor comprising:
    an oscillator for generating a master clock signal used by the integrated circuit sensor both when the integrated circuit is functioning in a test mode and when the integrated circuit sensor is functioning in a normal operational mode, wherein, when the integrated circuit sensor is functioning in a test mode, a frequency of the master clock signal is based at least in part on an externally generated programming signal provided to the integrated circuit sensor; and
    a fault test clock signal generator responsive to the master clock signal and to a test trigger signal for generating, during test of the integrated circuit sensor and when the integrated circuit sensor is functioning in its test mode, a test clock signal derived at least in part from the master clock signal, wherein the test clock signal comprises a launch pulse and a capture pulse used during at least a portion of delay fault testing of the integrated circuit sensor, the launch and capture pulses having rising and falling edges that substantially coincide with like edges of consecutive pulses of the master clock signal and having a controllable time spacing between an edge of the launch pulse and an edge of the capture pulse, wherein different values of the controllable time spacing are used for different fault tests and wherein the controllable time spacing is controlled based at least in part on information conveyed via the externally generated programming signal.

13. The integrated circuit sensor of claim 12 further comprising an output processor responsive to the master clock signal and to information relating to a ferromagnetic article disposed in proximity to the integrated circuit sensor when the integrated circuit sensor is functioning in normal operational mode, the output processor providing a sensor output signal indicative of one or more characteristics of the ferromagnetic article.

14. The integrated circuit sensor of claim 12 wherein the oscillator is responsive to a trim signal for adjusting the master clock signal.

15. A method, comprising:
generating, using an oscillator built into an integrated circuit sensor, a master clock signal used by the integrated circuit sensor both when the integrated circuit sensor is functioning in a test mode and when the integrated circuit sensor is functioning in a normal operational mode, wherein, when the integrated circuit sensor is functioning in a test mode, a frequency of the master clock signal is based at least in part on an externally generated programming signal provided to the integrated circuit sensor;
generating, during at least a portion of the testing of the integrated circuit sensor when functioning in test mode, a test clock signal, the test clock signal generated in response to the master clock signal and a test trigger signal, wherein the test clock signal is derived at least in part from the master clock signal and comprises a launch pulse and a capture pulse used during at least a portion of delay fault testing of the integrated circuit sensor, the launch and capture pulses having a controllable time spacing between an edge of the launch pulse and an edge of the capture pulse, wherein different values of the controllable time spacing are used for different fault tests and wherein the controllable time spacing is controlled based at least in part on information conveyed via the externally generated programming signal; and
generating, when the integrated circuit sensor is functioning in its normal operating mode, a sensor output signal based at least in part on the master clock signal and on information relating to a ferromagnetic article disposed in proximity to the integrated circuit sensor, the sensor output signal indicative of one or more characteristics of the ferromagnetic article.

16. The method of claim 15 wherein generating the sensor output signal includes providing a pulse having a pulse width indicative of a direction of rotation of the ferromagnetic article wherein the pulse width is established by the master clock signal.

17. The method of claim 15 wherein the launch pulse and capture pulse each have a rising and a falling edge substantially coincident with like edges of consecutive pulses of the master clock signal.

18. A method, comprising:
generating a master clock signal with an oscillator provided as part of an integrated circuit sensor, wherein the master clock signal is used by the integrated circuit sensor both when the integrated circuit sensor is functioning in a test mode and when the integrated circuit sensor is functioning in a normal operational mode, wherein, when the integrated circuit sensor is functioning in a test mode, a frequency of the master clock signal is based at least in part on an externally generated programming signal provided to the integrated circuit sensor; and
generating, during at least one test that the integrated circuit undergoes when functioning in test mode, a fault test clock signal in response to the master clock signal, the externally generated programming signal, and to a test trigger signal, wherein the fault test clock signal is derived at least in part directly from the master clock signal and comprises a launch pulse and a capture pulse used during at least a portion of delay fault testing of the integrated circuit sensor, the launch and capture pulses each having a rising edge and a falling edge substantially coincident with like edges of consecutive pulses of the master clock signal, wherein there is a controllable time spacing between an edge of the launch pulse and an edge of the capture pulse, wherein different values of the controllable time spacing are usable for different fault tests and wherein the controllable time spacing is based at least in part on information associated with the externally generated programming signal.

19. The method of claim 18 further comprising providing a trim signal to the oscillator to adjust the master clock signal.

20. The method of claim 18 further comprising providing a sensor output signal having pulses of a width established by the master clock signal and indicative of a direction of rotation of a ferromagnetic article in proximity to the sensor.

* * * * *

UNITED STATES PATENT AND TRADEMARK OFFICE
CERTIFICATE OF CORRECTION

PATENT NO. : 9,513,337 B2  
APPLICATION NO. : 13/290293  
DATED : December 6, 2016  
INVENTOR(S) : Glenn Forrest et al.

Page 1 of 1

It is certified that error appears in the above-identified patent and that said Letters Patent is hereby corrected as shown below:

In the Specification

Column 8, Line 12 delete "t0" and replace with --$t_0$--.

Column 9, Line 27 delete "submitted that that the" and replace with --submitted that the--.

Signed and Sealed this  
Fourteenth Day of November, 2017

Joseph Matal  
*Performing the Functions and Duties of the*  
*Under Secretary of Commerce for Intellectual Property and*  
*Director of the United States Patent and Trademark Office*